United States Patent
Wang

(10) Patent No.: US 7,660,376 B2
(45) Date of Patent: *Feb. 9, 2010

(54) CLOCK RECOVERING CIRCUIT UTILIZING A DELAY LOCKED LOOP FOR GENERATING AN OUTPUT CLOCK LOCKED TO AN ANALOG INPUT SIGNAL AND RELATED METHOD THEREOF

(75) Inventor: Ping-Ying Wang, Hsin-Chu (TW)

(73) Assignee: MediaTek Inc., Hsin-Chu, Hsien (TW)

( * ) Notice: Subject to any disclaimer, the term of this patent is extended or adjusted under 35 U.S.C. 154(b) by 649 days.

This patent is subject to a terminal disclaimer.

(21) Appl. No.: 11/458,388

(22) Filed: Jul. 19, 2006

(65) Prior Publication Data

US 2006/0250170 A1  Nov. 9, 2006

Related U.S. Application Data

(63) Continuation-in-part of application No. 10/906,096, filed on Feb. 3, 2005, now Pat. No. 7,102,403.

(51) Int. Cl.
*H04L 25/08* (2006.01)
(52) U.S. Cl. .................................. 375/354; 375/376
(58) Field of Classification Search .................. 375/354, 375/376
See application file for complete search history.

(56) References Cited

U.S. PATENT DOCUMENTS

| | | | |
|---|---|---|---|
| 5,384,552 A | 1/1995 | Iwasaki | |
| 5,406,427 A * | 4/1995 | Shimoda | 360/51 |
| 5,699,392 A * | 12/1997 | Dokic | 375/376 |
| 5,977,805 A | 11/1999 | Vergnes | |
| 6,275,547 B1 | 8/2001 | Saeki | |
| 6,424,185 B1 | 7/2002 | Wolf | |
| 6,765,424 B2 * | 7/2004 | Zampetti et al. | 327/292 |
| 6,959,064 B2 | 10/2005 | Spijker | |
| 7,010,077 B1 | 3/2006 | Dunlop | |
| 7,269,240 B2 * | 9/2007 | Hsu et al. | 375/376 |
| 7,421,054 B2 * | 9/2008 | Sumiyoshi | 375/376 |
| 2004/0202235 A1 * | 10/2004 | Kohli et al. | 375/150 |

FOREIGN PATENT DOCUMENTS

| | | |
|---|---|---|
| CN | 1092577 A | 9/1994 |
| CN | 1301100 A | 6/2001 |
| TW | 437154 | 5/2001 |
| TW | 532017 | 5/2003 |

* cited by examiner

*Primary Examiner*—Juan A Torres
(74) *Attorney, Agent, or Firm*—Winston Hsu

(57) ABSTRACT

A clock recovering circuit for generating an output clock locked to an analog input signal includes: a phase detection unit for receiving the analog input signal and the feedback clock for generating a phase error signal according to the analog input signal and the feedback clock; a loop filter coupled to the phase detector for filtering the phase error signal and generating a control signal; a numerically controlled oscillator (NCO) coupled to the loop filter for generating a first clock and an index signal according to the control signal; a delay locked loop (DLL) coupled to the NCO for receiving the first clock and generating a plurality of second clocks; and a multiplexer coupled to the NCO and the DLL for selecting one of the second clocks as the output clock according to the index signal.

23 Claims, 7 Drawing Sheets

CLOCK RECOVERING CIRCUIT UTILIZING A DELAY LOCKED LOOP FOR GENERATING AN OUTPUT CLOCK LOCKED TO AN ANALOG INPUT SIGNAL AND RELATED METHOD THEREOF

BACKGROUND OF INVENTION

The present invention relates to a clock recovering circuit, and more particularly, to a clock recovering circuit utilizing a delay locked loop for generating an output clock locked to an analog input signal and related method thereof.

A clock recovering circuit is commonly applied to a Partial-Response Maximum-Likelihood (PRML) read channel. Please refer to FIG. 1. FIG. 1 shows a first related art clock recovering circuit 100. The clock recovering circuit 100 includes an analog-to-digital converter (ADC) 110, a phase detector 120, a loop filter 130, a digital-to-analog converter (DAC) 140, and a voltage controlled oscillator (VCO) 150. The clock recovering circuit 100 utilizes the ADC 110 to sample an analog input signal $S_A$, an Eight-to-Fourteen Modulation (EFM) signal for example, according to a recovering clock $CLK_{out}$ generated from the VCO 150, and then converts the analog input signal $S_A$ into a digital output signal $S_D$ having a plurality of digital values. The above-mentioned recovering clock $CLK_{out}$ is generated under the operation of the phase detector 120, the loop filter 130, the DAC 140, and the VCO 150. The action of the above four elements is like a well-known phase locked loop (PLL), which is used to lock a correct recovering clock $CLK_{out}$ that is capable of driving the ADC 110 to sample the input analog $S_A$ at desired timing. In other words, the output digital data $S_D$ can be correctly generated by converting the analog data $S_A$, which is sampled by the correctly-locked recovering clock $CLK_{out}$, to digital sample values.

FIG. 2 shows a second related art clock recovering circuit 200. The clock recovering circuit 200 includes an ADC 210, a phase detector 220, a loop filter 230, a numerically controlled oscillator (NCO) 240, and a data interpolator 250. The ADC 210 utilizes a reference clock $CLK_{ref}$ to sample an analog input signal $S_A$, and then converts the analog signal $S_A$ to a digital signal $S_D$ having a plurality of digital values. Commonly, the reference clock $CLK_{ref}$ is provided by a clock source such as a related art PLL. As one can see, the data interpolator 250 performs interpolation according to the digital signal $S_D$ and an index signal $I_\Theta$, which is utilized to provide information related to an amount of phase error due to the reference clock $CLK_{ref}$ sampling the analog signal $S_A$ at erroneous timing. Since the phase error is notified by the index signal $I_\Theta$, the data interpolator 250, therefore, is capable of compensating the phase error through interpolating a plurality of digital values of the digital signal $S_D$ according to the index signal $I_\Theta$. That is, another digital signal $S_D'$, which is ideally free of the phase error caused by the erroneous sampling timing, is outputted from the data interpolator 250.

The above-mentioned index signal $I_\Theta$ is generated under the operation of the phase detector 220, the loop filter 230 and the NCO 240, and the action of the above three elements is like a well-known digital phase locked loop (DPLL). Because the functionality and operation of the phase detector 220, loop filter 230, and NCO 240 are known to those skilled in the art, further discussion of their operation is omitted for the sake of brevity.

As one can see, the first related art clock recovering circuit 100 and the second related art clock recovering circuit 200 are both capable of generating the desired data, i.e., the output digital data $S_D$ and the digital signal $S_D'$. The key difference is that the first related art clock recovering circuit 100 gets the desired data through tuning the recovering clock $CLK_{out}$, and the second related art clock recovering circuit 200 acquires the desired data through tuning the incoming digital values.

However, as shown in FIG. 1, the first related art clock recovering circuit 100 utilizes the ADC 110, which is easily affected by noise and results in poor performance. In addition, in order to achieve better performance, a DAC having high resolution and a VCO having wide operation range are needed, which makes the first related art clock recovering circuit 100 not easy to implement. Concerning the second related art clock recovering circuit 200, it makes use of the data interpolator 250 to interpolate the desired digital data according to the non-linear input, that is, the digital signal SD. The data interpolator 250, generally speaking, is sure to occupy a large chip area, which makes it difficult to have a compact chip size. Furthermore, the interpolation result may include wrong values due to the non-linear input.

SUMMARY OF INVENTION

One objective of the claimed invention is therefore to provide a clock recovering circuit utilizing a delay locked loop for generating an output clock locked to an analog input signal and method thereof, to solve the above-mentioned problems.

According to an exemplary embodiment of the claimed invention, a clock recovering circuit for generating an output clock that is locked to an analog input signal is disclosed. The clock recovering circuit comprises: a phase detection unit for receiving the analog input signal and the output clock for generating a phase error signal according to the analog input signal and the output clock; a loop filter coupled to the phase detector for filtering the phase error signal and generating a control signal; a numerically controlled oscillator coupled to the loop filter for generating a first clock and an index signal according to the control signal; a delay locked loop coupled to the numerically controlled oscillator for receiving the first clock and generating a plurality of second clocks; and a multiplexer coupled to the numerically controlled oscillator and the delay locked loop for selecting one of the plurality of second clocks as the output clock according to the index signal.

According to an exemplary embodiment of the claimed invention, a method for generating an output clock that is locked to an analog input signal is disclosed. The method comprises: generating a phase error signal representing a phase error between the analog input signal and the output clock; filtering the phase error signal and generating a control signal; generating a first clock and an index signal by feeding the control signal to a numerically controlled oscillator, which is clocked by a reference clock having a preset frequency; providing a delay locked loop, and utilizing the delay locked loop for receiving the first clock and generating a plurality of second clocks; and selecting one of the second clocks as the output clock according to the index signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
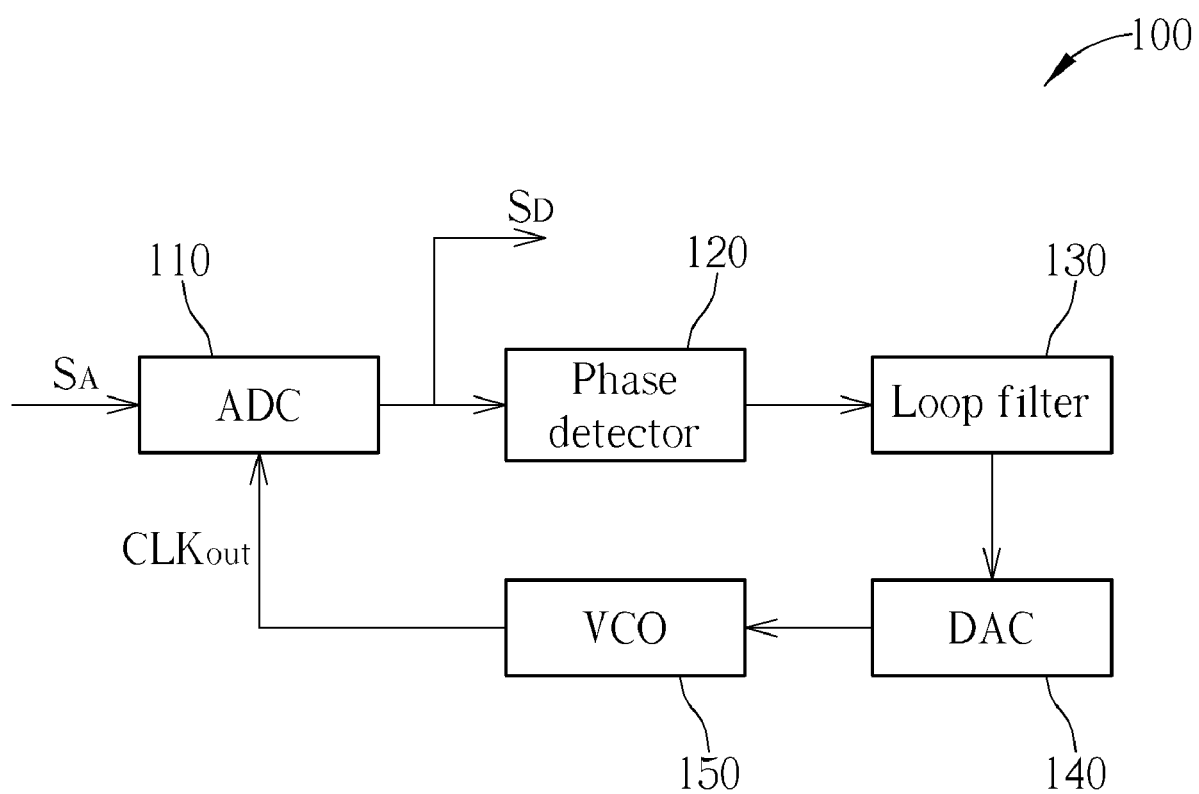
FIG. 1 is a block diagram of a first related art clock recovering circuit.
Figure 2:
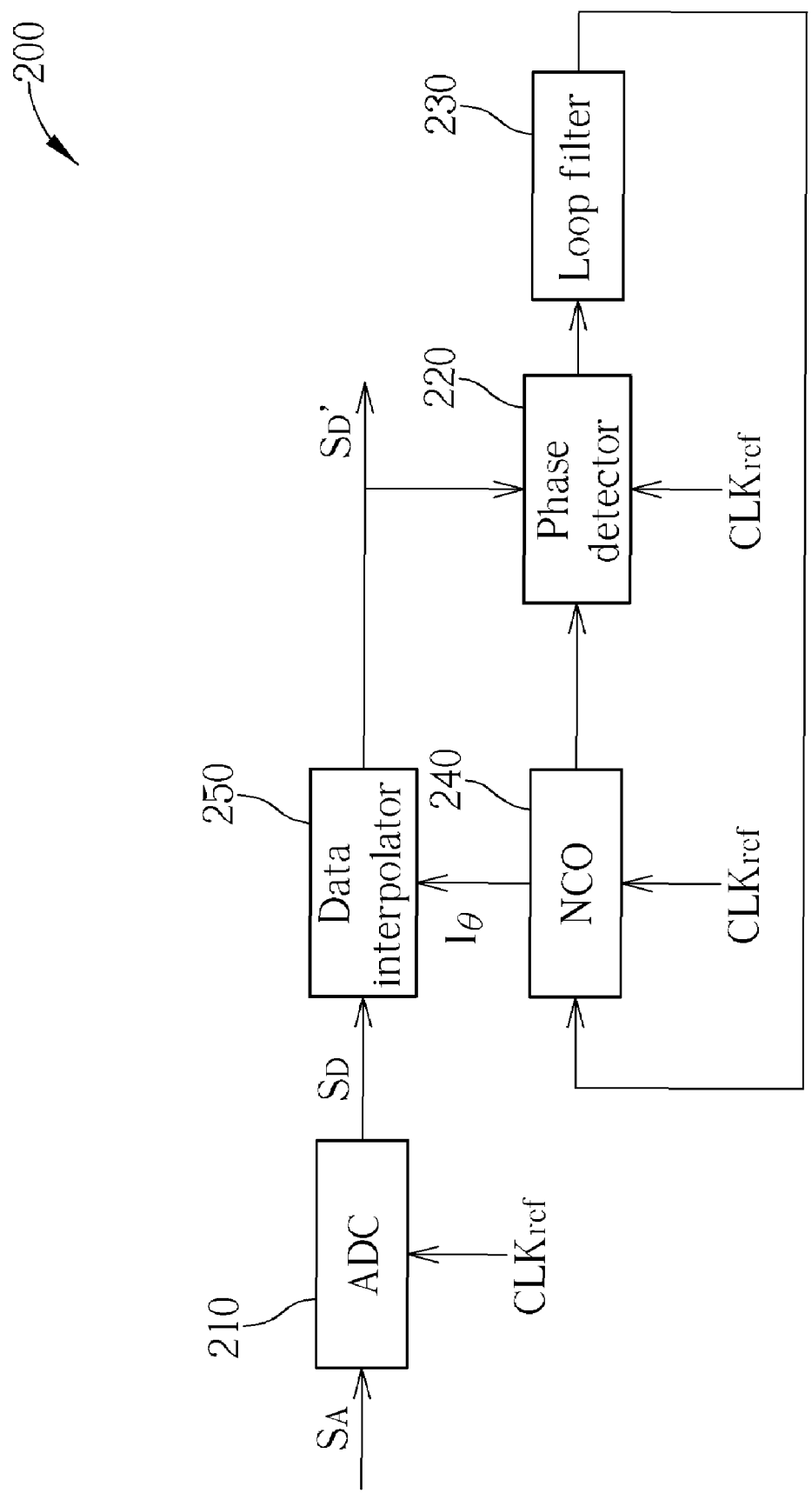
FIG. 2 is a block diagram of a second related art clock recovering circuit.
Figure 3:
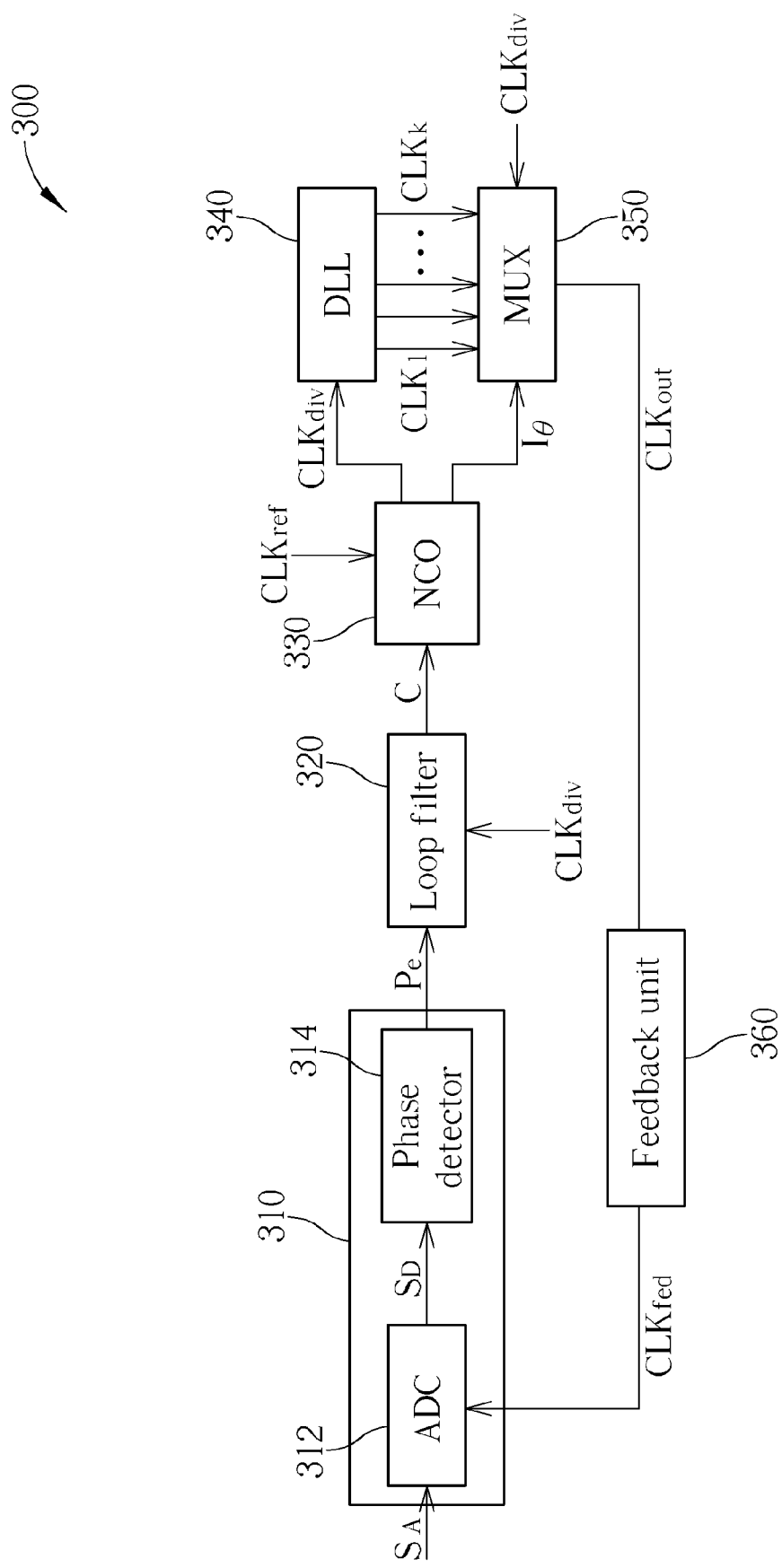
FIG. 3 is a block diagram of a clock recovering circuit according to a first embodiment of the present invention.

Please refer to FIG. 3. FIG. 3 is a clock recovering circuit 300 according to a first embodiment of the present invention. The clock recovering circuit 300 is used for generating an output clock $CLK_{out}$ that is locked to an analog input signal $S_A$. As shown in FIG. 3, the clock recovering circuit 300 includes a phase detection unit 310 for generating a phase error signal $P_e$ representing a phase error between the analog input signal $S_A$ and a feedback clock $CLK_{fed}$, a loop filter 320 coupled to the phase detection unit 310 for filtering the phase error signal $P_e$ and generating a control signal C, a numerically controlled oscillator (NCO) 330 coupled to the loop filter 320 for generating a clock $CLK_{div}$ and an index signal $I_\ominus$ according to the control signal C, a delay locked loop (DLL) 340 coupled to the NCO 330 for receiving the clock $CLK_{div}$ and generating a plurality of clocks $CLK_1 \sim CLK_K$ where K is a positive integer, and a multiplexer (MUX) 350 coupled to the NCO 330 and the DLL 340 for selecting one of the clocks $CLK_1 \sim CLK_K$ as the output clock $CLK_{out}$ according to the index signal $I_\ominus$. Additionally, the phase detection unit 310 comprises an analog-to-digital converter (ADC) 312 and a phase detector 314. Each element of the present invention clock recovering circuit 300 is detailed as follows.

In this embodiment, the analog input signal $S_A$ is, as an example, an Eight-to-Fourteen Modulation (EFM) signal. The ADC 312 converts the analog input signal $S_A$ to a digital input signal $S_D$ wherein the ADC 312 is clocked by the feedback clock $CLK_{fed}$. In other words, the ADC 312 utilizes the feedback clock $CLK_{fed}$ as a sampling clock to sample the analog input signal $S_A$ and then converts the sampled analog input signal $S_A$ to the digital input signal $S_D$ having a plurality of digital values. The phase detector 314 is coupled to the ADC 312 for generating a phase error signal $P_e$ according to the digital input signal $S_D$. The operation of the phase detector 314 differs from a related art phase detector, which compares two incoming signals to detect a phase error. The phase detector 314 here directly utilizes the sampling timing of the digital values within the digital input signal $S_D$ to determine the phase error. However, the essence of these two kinds of phase detector is the same since the digital input signal $S_D$ inputted into the phase detector 314 comprises the information of both the analog input signal $S_A$ and the feedback clock $CLK_{fed}$.

The loop filter 320 is a kind of proportional-integral filter for filtering the phase error signal $P_e$ and generating a control signal C. The control signal C comprises two parts: one is an integer part $C_I$ and the other is a fractional part $C_F$. For example, suppose the control signal C is an N-bit signal, the leading $N_1$ bits represent the integer part $C_I$ of the control signal C, and the remaining $N_2$ bits represent the fractional part $C_F$ of the control signal C, wherein $N=N_1+N_2$. Because the process and operation of the proportional-integral filter is known to those skilled in the art, further discussion is omitted for the sake of brevity. The NCO 330 is coupled to the loop filter 320 for generating the clock $CLK_{div}$ and the index signal $I_\ominus$ according to the integer part $C_I$ and fractional part $C_F$ carried by the control signal C respectively. The NCO 330 is clocked by a reference clock $CLK_{ref}$ having a preset period $T_{ref}$. Further discussion about the NCO 330 will be detailed later. The DLL 340 is used for receiving the clock $CLK_{div}$ and generating a plurality of clocks $CLK_1 \sim CLK_K$. Please note that the DLL 340 can be an analog DLL or a digital DLL. Each of the clocks $CLK_1 \sim CLK_K$ has a different delay phase of the clock $CLK_{div}$, and the edges of these clocks $CLK_1 \sim CLK_K$ are substantially evenly spaced within one period of the reference clock $CLK_{ref}$. Because the process and operation of the DLL 340 is known to those skilled in the art, further discussion is omitted for the sake of brevity. Finally, the MUX 350 selects one of the clocks $CLK_1 \sim CLK_K$ as the output clock $CLK_{out}$ according to the index signal $I_\ominus$. For example, if K=8, a clock set including $CLK_1$, $CLK_2$, $CLK_3$, $CLK_4$, $CLK_5$, $CLK_6$, $CLK_7$, and $CLK_8$ is generated from the DLL 340. Suppose the value of the index signal $I_\ominus$ is equal to three, the MUX 350 selects the clock $CLK_3$ out of the clock set according to the index signal $I_\ominus$ equaling three. Please note that, in this embodiment, the loop filter 320 and the MUX 350 are both clocked by the same clock $CLK_{div}$. In other words, the loop filter 320 and the MUX 350 are activated each time the clock $CLK_{div}$ is triggered (positive or negative trigger). Alternatively, the MUX 530 can be clocked by the output clock $CLK_{out}$.

The feedback clock $CLK_{fed}$ feeds back to the phase detection unit 310 based on the output clock $CLK_{out}$. In one embodiment, the output clock $CLK_{out}$ serves as the feedback clock $CLK_{fed}$. A feedback unit 360 is optionally coupled between the phase detection unit 310 and the MUX 350. In one embodiment, the feedback unit 360 is a divider for dividing the output clock to generate the feedback clock $CLK_{fed}$. In another embodiment, the feedback unit 360 is a multiplier for multiplying the output clock $CLK_{out}$ to generate the feedback clock $CLK_{fed}$.

Figure 4:
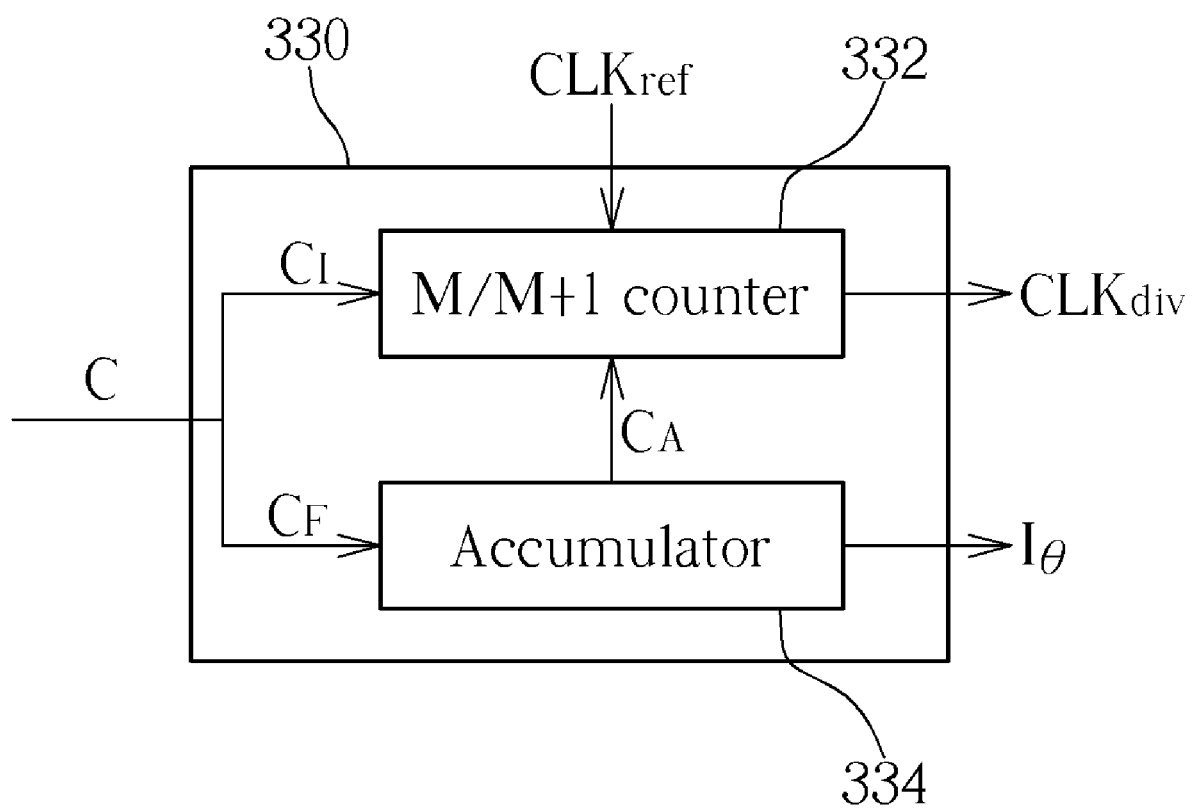
FIG. 4 is a block diagram of an NCO shown in FIG. 3.

Please refer to FIG. 4. FIG. 4 is a block diagram of the NCO 330 shown in FIG. 3. In this embodiment, the NCO 330 comprises an M/M+1 counter 332 and an accumulator 334. The value M is set to the value of the integer part $C_I$ of the control signal C. The M/M+1 counter 332 triggers the clock $CLK_{div}$ every M or M+1 times the reference clock $CLK_{ref}$ is counted according to a carry signal $C_A$ generated from the accumulator 334. For example, if the carry signal $C_A$ is equal to logic "0", the M/M+1 counter 332 triggers the clock $CLK_{div}$ every M times the reference clock $CLK_{ref}$ is counted. If the carry signal $C_A$ is equal to logic "1", the M/M+1 counter 332 triggers the clock $CLK_{div}$ every M+1 times the reference clock $CLK_{ref}$ is counted. The accumulator 334 accumulates the fractional part $C_F$ of the control signal C to generate the required index signal $I_\ominus$.

Figure 5:
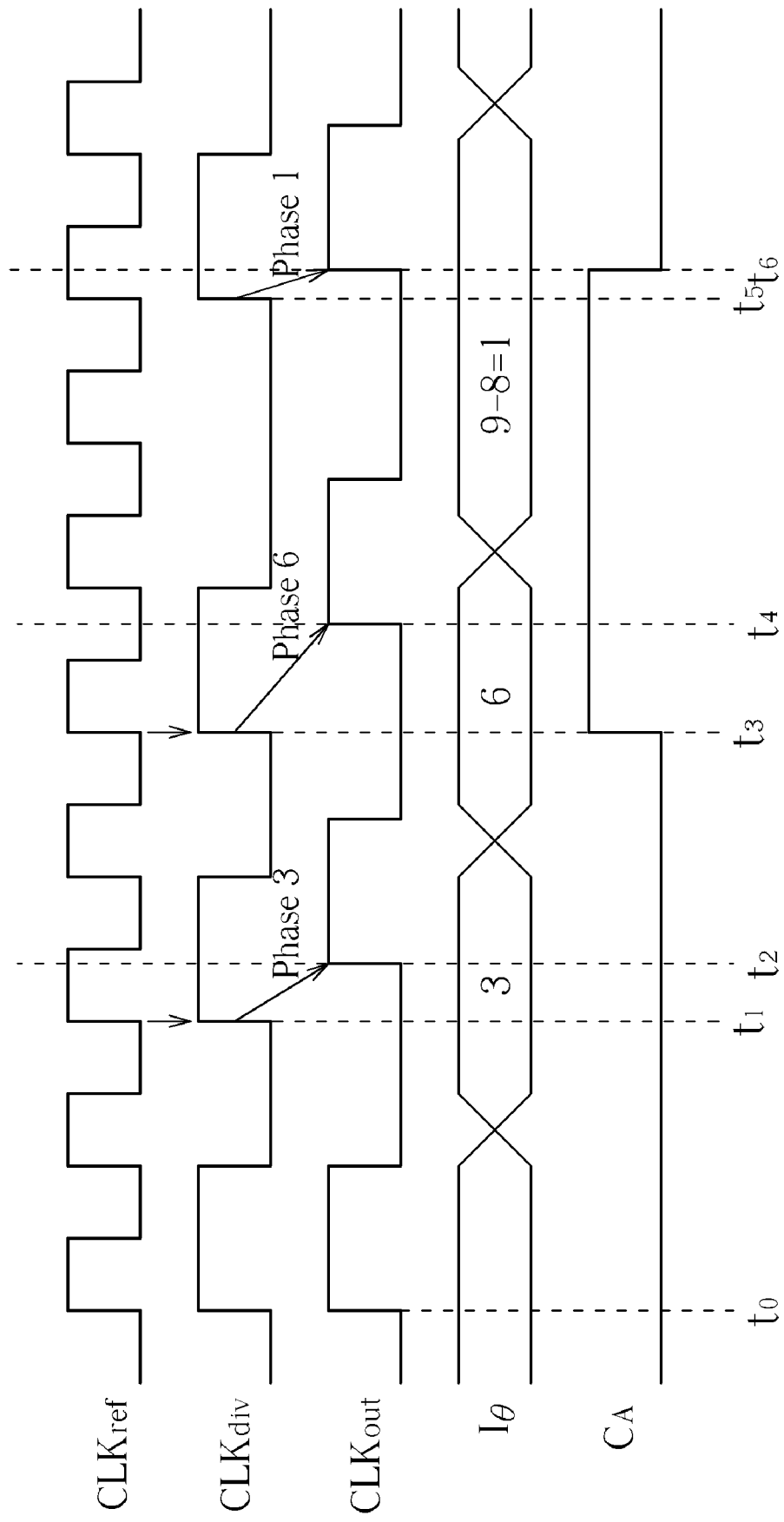
FIG. 5 is a timing diagram illustrating operation of the clock recovering circuit shown in FIG. 3.

Please refer to FIG. 5. FIG. 5 is a timing diagram illustrating the reference clock $CLK_{ref}$, the clock $CLK_{div}$, the output clock $CLK_{out}$, the index signal $I_\ominus$, and the carry signal $C_A$ according to the first embodiment of the present invention. In this example, the value M of M/M+1 counter 332 is set to two (hereinafter, the M/M+1 counter 332 is called ⅔ counter 332) and the index signal $I_\ominus$ is a 3-bit signal. The corresponding clock set produced by the DLL 340 has clocks $CLK_1$, $CLK_2$, $CLK_3$, $CLK_4$, $CLK_5$, $CLK_6$, $CLK_7$, and $CLK_8$. At time $t_1$, the ⅔ counter 332 triggers the clock $CLK_{div}$ from logic "0" to logic "1" when the reference clock $CLK_{ref}$ is counted two times continuously. At time $t_2$, the output clock $CLK_{out}$ is set by the clock $CLK_3$, whose delay phase is equal to $(3/8)*T_{ref}$, since the index signal $I_\ominus$ is equal to three at this moment. At time $t_3$, the ⅔ counter 332 triggers the clock $CLK_{div}$ from logic "0" to logic "1" when the reference clock $CLK_{ref}$ is again counted two times continuously. At this moment, the carry signal $C_A$ becomes logic "1", so next time the reference clock $CLK_{ref}$ needs to be counted three times continuously. At time $t_4$, the output clock $CLK_{out}$ is set by the clock $CLK_6$, whose delay phase is equal to (⅝)*$T_{ref}$ since the index signal $I_\ominus$ is equal to six at this moment. At time $t_5$, the ⅔ counter 332 triggers the clock $CLK_{div}$ from logic "0" to logic "1" when the reference clock $CLK_{ref}$ is counted three times continuously. In addition, the carry signal $C_A$ is reset accordingly after the reference clock $CLK_{ref}$ is counted three times. At time $t_6$, the output clock $CLK_{out}$ is set by the clock $CLK_1$, whose delay phase is equal to (⅛)*$T_{ref}$ since the index signal $I_\ominus$ is equal to one at this moment.

Figure 6:
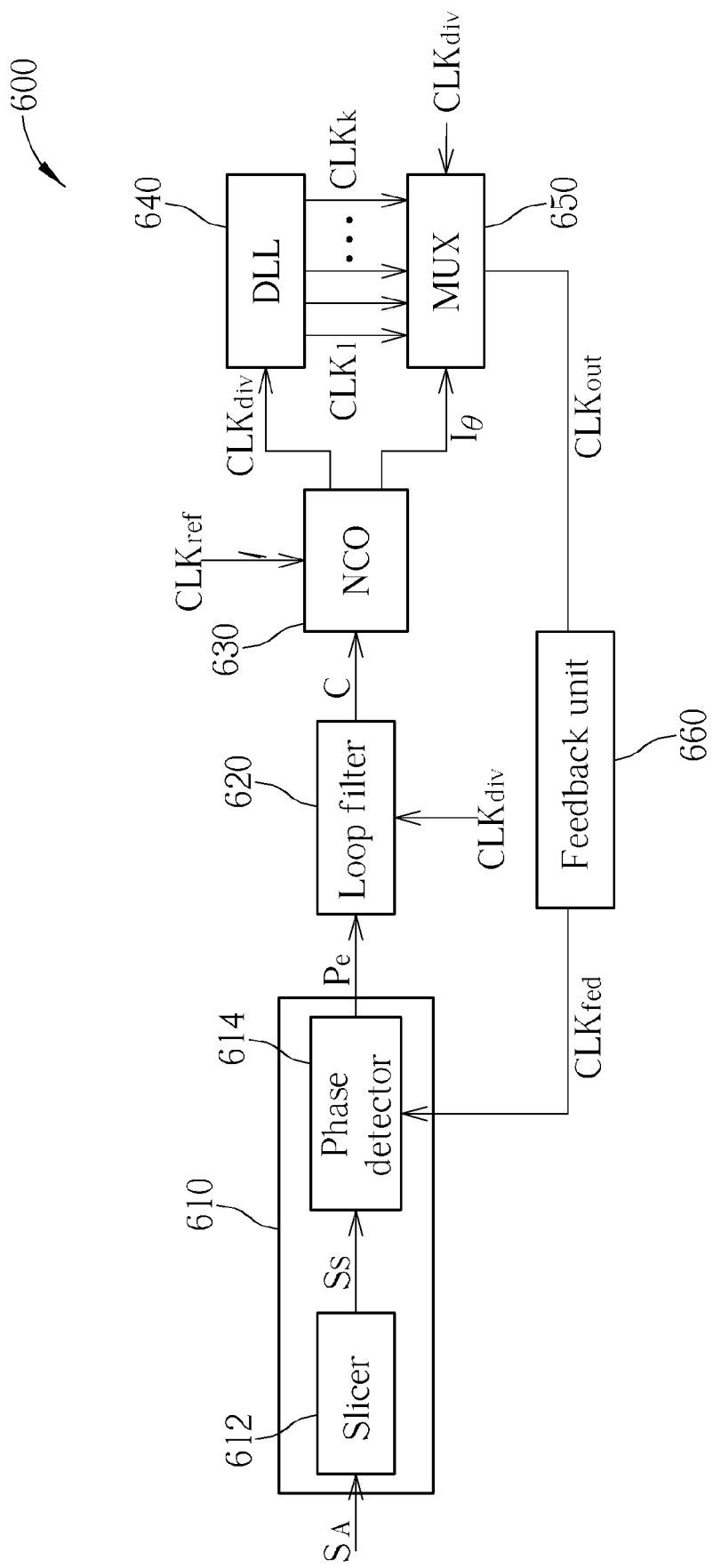
FIG. 6 is a block diagram of a clock recovering circuit according to a second embodiment of the present invention.

Please refer to FIG. 6. FIG. 6 is a block diagram of a clock recovering circuit 600 according to a second embodiment of the present invention. The clock recovering circuit 600 includes a phase detection unit 610, a loop filter 620, an NCO 630, a DLL 640, and an MUX 650. The implementation of the elements in the second embodiment are the same as those in the first embodiment except the phase detection unit 610. The phase detection unit 610 comprises a slicer 612 and a phase detector 614. The slicer 612 slices the analog input signal $S_A$ to generate a sliced signal $S_S$ (square wave). The phase detector 614 coupled to the slicer 612 detect a phase error between the sliced signal $S_S$ and a feedback clock $CLK_{fed}$ which is generated by a feedback unit 660 according to an output clock $CLK_{out}$, and then generates a phase error signal $P_e$. Because the operation of the other elements in the second embodiment is the same as those in the first embodiment, further description of these elements is omitted for the sake of brevity.

Figure 7:
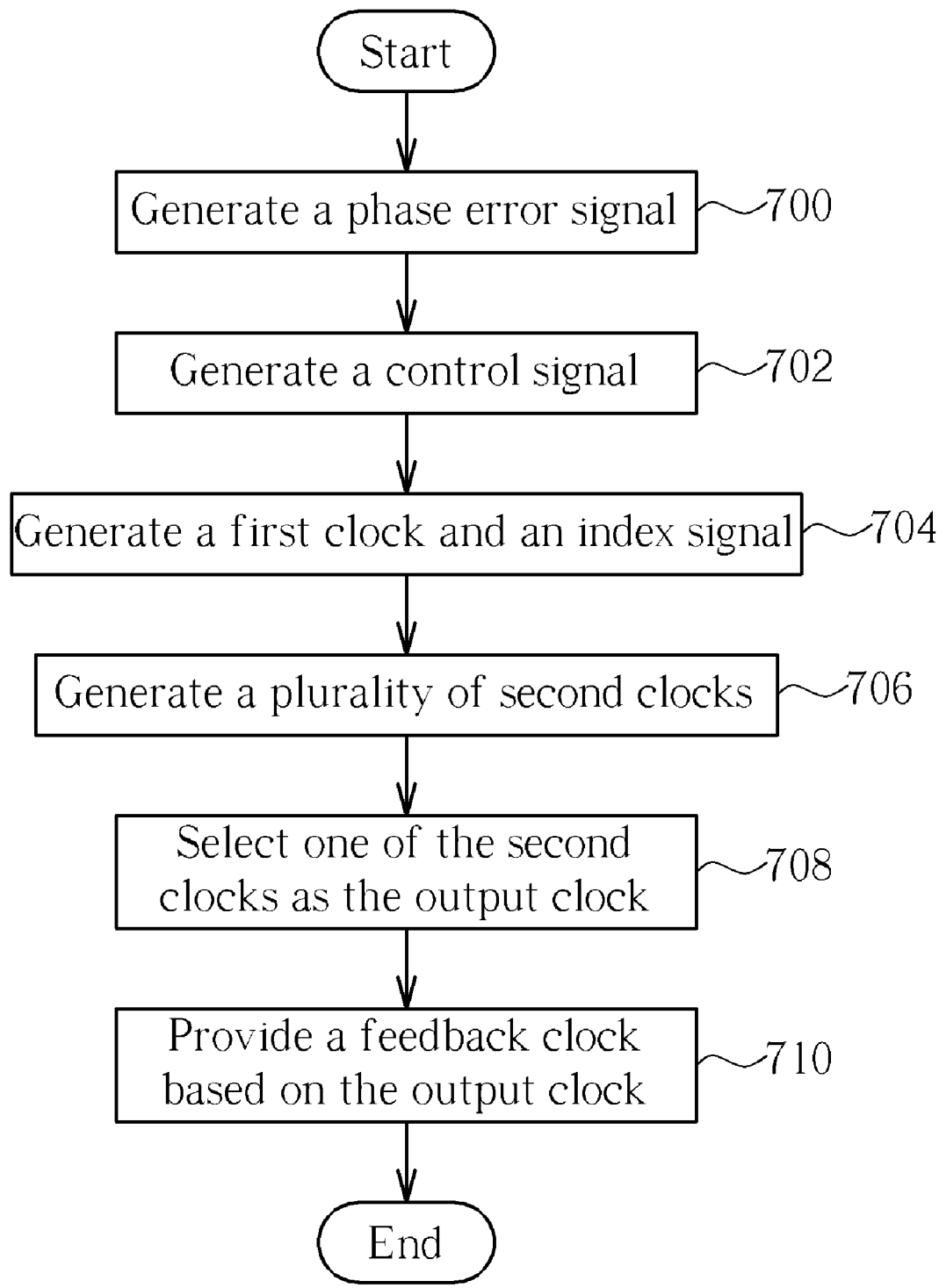
FIG. 7 is a flowchart describing a general method of generating an output clock that is locked to an analog input signal according to the present invention.

FIG. 7 is a flowchart describing a general method of generating an output clock that is locked to an analog input signal according to the embodiments of the present invention. The flowchart includes the following steps:

Step 700: Generate a phase error signal $P_e$ representing a phase error between the analog input signal $S_A$ and a feedback clock $CLK_{fed}$.

Step 702: Filter the phase error signal $P_e$ and generate a control signal C.

Step 704: Generate a first clock $CLK_{div}$ and an index signal $I_\ominus$ by feeding the control signal to C a numerically controlled oscillator, which is clocked by a reference clock $CLK_{ref}$ having a preset frequency.

Step 706: Provide a delay locked loop, and utilize the delay locked loop for receiving the first clock $CLK_{div}$ and generating a plurality of second clocks $CLK_1$~CLKK.

Step 708: Select one of the second clocks $CLK_1$~$CLK_K$ as the output clock $CLK_{out}$ according to the index signal $I_\ominus$.

Step 710: Provide the feedback clock based on the output clock.

In one embodiment in the step 710, the output clock $CLk_{out}$ serves as the feedback clock $CLK_{fed}$.

In another embodiment, the step 710 comprises dividing the output clock $CLK_{out}$ to generate the feedback clock $CLK_{fed}$.

In still another embodiment, the step 710 comprises multiplying the output clock $CLK_{out}$ to generate the feedback clock $CLK_{fed}$.

Since the detailed description of the flowchart is described in the embodiments of the present invention, further discussion is omitted for the sake of brevity.

All the presented embodiments of the clock recovering circuit according to the present invention offer different schemes from the related art clock recovering circuits. The first related art clock recovering circuit utilizes the element ADC, which is easily affected by noise and results in poor performance. The second related art clock recovering circuit is similar to the present invention clock recovering circuit. The differences between the present invention and this second related art are described as follows.

The second related art clock recovering circuit can only provide a digital output signal, which is already dealt with by the process of clock recovery. But the clock recovering circuits according to the present invention can provide not only the digital output signal, which is already dealt with by the process of clock recovery, but also the recovering clock. The extra provided recovering clock can offer far greater flexibility for a system designer. Additionally, the clock recovery processes of the second related art and the present inventions are different. The second related art clock recovering circuit utilizes the data interpolator to interpolate the wanted digital signal according to the index signal. But the present invention utilizes the DLL to implement the interpolation of the recovering clock. So the present invention has higher performance than the second related art since the interpolation object is the recovering clock, which is linear, rather than the incoming digital signal, which is non-linear.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock recovering circuit for generating an output clock that is locked to an analog input signal, comprising:
   a phase detection unit for generating a phase error signal representing a phase error between the analog input signal and a feedback clock;
   a loop filter coupled to the phase detector for filtering the phase error signal and generating a control signal;
   a numerically controlled oscillator coupled to the loop filter for generating a first clock and an index signal according to the control signal, wherein the numerically controlled oscillator is clocked by a reference clock having a preset frequency;
   a delay locked loop coupled to the numerically controlled oscillator for receiving the first clock and generating a plurality of second clocks; and
   a multiplexer coupled to the numerically controlled oscillator and the delay locked loop for selecting one of the second clocks as the output clock according to the index signal;
   wherein the feedback clock feeds back to the phase detection unit based on the output clock.

2. The clock recovering circuit of claim 1, wherein the clock recovering circuit further comprises: a divider for dividing the output clock to generate the feedback clock.

3. The clock recovering circuit of claim 1, wherein the clock recovering circuit further comprises: a multiplier for multiplying the output clock to generate the feedback clock.

4. The clock recovering circuit of claim 1, wherein the phase detection unit comprises:
   an analog-to-digital converter for converting the analog input signal to a digital input signal wherein the analog-to-digital converter is clocked by the feedback clock; and
   a first phase detector coupled to the analog-to-digital converter for generating a phase error signal according to the digital input signal.

5. The clock recovering circuit of claim 1, wherein the phase detection unit comprises:

a slicer for slicing the analog input signal to a sliced input signal; and a second phase detector for generating a phase error signal according to the sliced input signal and the feedback clock.

6. The clock recovering circuit of claim 1, wherein the loop filter, and the multiplexer are clocked by the first clock.

7. The clock recovering circuit of claim 1, wherein the loop filter is clocked by the first clock and the multiplexer is clocked by the output clock.

8. The clock recovering circuit of claim 1, wherein the edges of the plurality of second clocks output from the delay locked loop are substantially evenly spaced within one period of the reference clock.

9. The clock recovering circuit of claim 1, wherein the delay locked loop is an analog delay locked loop.

10. The clock recovering circuit of claim 1, wherein the delay locked loop is a digital delay locked loop.

11. The clock recovering circuit of claim 1, wherein the loop filter is a proportional-integral filter.

12. The clock recovering circuit of claim 1, wherein the analog input signal is an EFM (Eight-to-Fourteen Modulation) signal.

13. A method for generating an output clock that is locked to an analog input signal comprising:
   (a) generating a phase error signal representing a phase error between the analog input signal and a feedback clock;
   (b) filtering the phase error signal and generating a control signal;
   (c) generating a first clock and an index signal by feeding the control signal to a numerically controlled oscillator, which is clocked by a reference clock having a preset frequency;
   (d) providing a delay locked loop, and utilizing the delay locked loop for receiving the first clock and generating a plurality of second clocks;
   (e) selecting one of the second clocks as the output clock according to the index signal; and
   (f) providing the feedback clock based on the output clock.

14. The method of claim 13, wherein the step (f) comprises dividing the output clock to generate the feedback clock.

15. The method of claim 13, wherein the step (f) comprises multiplying the output clock to generate the feedback clock.

16. The method of claim 13, wherein the step (a) further comprises: converting the analog input signal to a digital input signal wherein the conversion is performed by an analog-to-digital converter clocked by the feedback clock; and generating a phase error signal according to the digital input signal.

17. The method of claim 13, wherein the step (a) further comprises: slicing the analog input signal to a sliced input signal; and generating a phase error signal according to the sliced input signal and the feedback clock.

18. The method of claim 13, wherein operation of steps (b) and (e) are clocked by the first clock.

19. The method of claim 13, wherein operation of step (b) is clocked by the first clock and operation of step (e) is clocked by the output clock.

20. The method of claim 13, wherein the edges of the plurality of second clocks are substantially evenly spaced within one period of the reference clock.

21. The method of claim 13, wherein the phase error signal comprises an integral error signal and a proportional error signal.

22. The method of claim 21, wherein the control signal comprises an integral control signal and a proportional control signal, and step (b) generates the integral control signal and the proportional control signal by feeding the integral error signal and the proportional error signal to a proportional-integral filtering.

23. The method of claim 13, wherein the analog input signal is an EFM signal.

* * * * *

UNITED STATES PATENT AND TRADEMARK OFFICE
CERTIFICATE OF CORRECTION

PATENT NO. : 7,660,376 B2 Page 1 of 1
APPLICATION NO. : 11/458388
DATED : February 9, 2010
INVENTOR(S) : Ping-Ying Wang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 854 days.

Signed and Sealed this

Twenty-eighth Day of December, 2010

David J. Kappos
*Director of the United States Patent and Trademark Office*